(12) United States Patent
Cebi

(10) Patent No.: US 10,147,990 B2
(45) Date of Patent: Dec. 4, 2018

(54) LOW-NOISE AMPLIFIER WITH LOW-LOSS BYPASS MODE

(71) Applicant: SKYWORKS SOLUTIONS, INC., Woburn, MA (US)

(72) Inventor: Haki Cebi, Orlando, FL (US)

(73) Assignee: SKYWORKS SOLUTIONS, INC., Woburn, MA (US)

(*) Notice: Subject to any disclaimer, the term of this patent is extended or adjusted under 35 U.S.C. 154(b) by 0 days.

(21) Appl. No.: 15/685,276

(22) Filed: Aug. 24, 2017

(65) Prior Publication Data

US 2018/0062231 A1 Mar. 1, 2018

Related U.S. Application Data

(60) Provisional application No. 62/380,009, filed on Aug. 26, 2016.

(51) Int. Cl.
| | |
|---|---|
| *H03F 1/14* | (2006.01) |
| *H01P 1/20* | (2006.01) |
| *H03F 3/72* | (2006.01) |
| *H03F 3/19* | (2006.01) |
| *H03F 3/60* | (2006.01) |
| *H04B 1/401* | (2015.01) |
| *H03F 1/52* | (2006.01) |
| *H03F 3/24* | (2006.01) |

(52) U.S. Cl.
CPC ............ *H01P 1/20* (2013.01); *H03F 1/52* (2013.01); *H03F 3/19* (2013.01); *H03F 3/245* (2013.01); *H03F 3/602* (2013.01); *H03F 3/72* (2013.01); *H04B 1/401* (2013.01); *H03F 2200/294* (2013.01); *H03F 2200/451* (2013.01)

(58) Field of Classification Search
CPC ........................................................ H03F 3/72

USPC ............................................................ 330/51
See application file for complete search history.

(56) References Cited

U.S. PATENT DOCUMENTS

| | | | | |
|---|---|---|---|---|
| 7,579,909 B2* | 8/2009 | Bakalski | ............... | H03F 1/0205 |
| | | | | 330/124 D |
| 2009/0295472 A1* | 12/2009 | Vice | ...................... | H03F 1/0277 |
| | | | | 330/51 |

OTHER PUBLICATIONS

Morkner et al., "A 1.7mA Low Noise Amplifier with Integrated Bypass Switch for Wireless 0.05-6 GHz Portable Applications", IEEE MTT-S Digest, 2001, pp. 293-296.

* cited by examiner

*Primary Examiner* — Steven J Mottola
(74) *Attorney, Agent, or Firm* — Lando & Anastasi, LLP

(57) ABSTRACT

Aspect and examples described herein provide radio-frequency amplifier circuits and methods. In one example, an amplifier circuit comprises a bypass circuit selectively coupled between an input and an output via at least one bypass switch, the at least one bypass switch configured to couple the input and the output through the bypass circuit during a bypass mode of operation, a low-noise amplifier circuit coupled between the input and the output and including a transistor, the transistor configured to couple the input and the output through the low-noise amplifier circuit during a low-noise amplifier mode of operation, a direct-current switch coupled to the bypass circuit and the low-noise amplifier circuit and configured to select between the bypass mode and the low-noise amplifier mode, and an inductor interposed between the input and the direct-current switch, the inductor being coupled to electrical ground via the direct-current switch during the low-noise amplifier mode.

20 Claims, 13 Drawing Sheets

LOW-NOISE AMPLIFIER WITH LOW-LOSS BYPASS MODE

CROSS-REFERENCE TO RELATED APPLICATIONS

This application claims the benefit under 35 U.S.C. § 119(e) of U.S. Provisional Application No. 62/380,009, titled "LOW-NOISE AMPLIFIER WITH LOW-LOSS BYPASS MODE," filed on Aug. 26, 2016 which is herein incorporated by reference in its entirety for all purposes.

BACKGROUND

Many wireless device designs, such as those for smartphones and tablets, require amplification of very low-power signals without significant degradation of a signal-to-noise ratio. The use of low-noise amplifiers (LNA) and impedance matching networks to minimize the amount of additional noise in wireless device designs is generally known. In particular, LNAs that include a bypass switch should provide a large gain, minimal return loss, and a high linearity across an operating frequency band, as well as, limit the amount of noise in the device. Accordingly, some LNAs include two amplifier stages consisting of a first stage common source gain stage and a second stage source follower that acts as an impedance matching network.

SUMMARY

Aspects and examples described herein relate to electronic systems and, in particular, to radio-frequency transistor-based amplifier circuits. Various aspects and embodiments provide an amplifier circuit that minimizes an impedance mismatch when switching between a bypass mode of operation and a low-noise amplifier (LNA) mode of operation. Moreover, according to various aspects, examples of the amplifier circuit described herein may also maintain a low insertion loss and high third-order intercept point (IP3) during a bypass mode of operation.

Certain examples of the amplifier circuits discussed herein may include a direct-current (DC) switch that is coupled to a bypass circuit and a low-noise amplifier (LNA) circuit. The DC switch is configured to switch the amplifier circuit between the bypass mode of operation, and the LNA mode of operation by coupling or de-coupling one or more components of the LNA circuit and/or bypass circuit to an electrical ground (e.g., DC ground). In these examples, the amplifier circuit may include an inductor coupled between an input and the DC switch such that when the DC switch opens during the bypass mode of operation, the inductor couples a transistor of the LNA circuit to a controlled voltage such that the transistor is biased in the ON state. Accordingly, during the bypass mode of operation, the transistor of the LNA circuit has a low impedance path in series with the inductor. Such an arrangement significantly improves the performance of the bypass circuit during the bypass mode of operation.

According to an aspect of the present disclosure, provided is an amplifier circuit. In one example the amplifier circuit comprises an input to receive a radio-frequency signal, an output, a bypass circuit selectively coupled between the input and the output via at least one bypass switch, the at least one bypass switch being configured to couple the input and the output through the bypass circuit during a bypass mode of operation of the amplifier circuit, a low-noise amplifier circuit coupled between the input and the output and including at least one transistor, the at least one transistor being configured to couple the input and the output through the low-noise amplifier circuit during a low-noise amplifier mode of operation of the amplifier circuit, a direct-current switch coupled to at least the bypass circuit and the low-noise amplifier circuit and configured to select between the bypass mode of operation and the low-noise amplifier mode of operation, and an inductor interposed between the input and the direct-current switch, the inductor being coupled to an electrical ground via the direct-current switch during the low-noise amplifier mode of operation.

According to various examples, the direct-current switch is configured to de-couple the inductor from the electrical ground during the bypass mode of operation. In some examples, the amplifier circuit further comprises a bias resistor coupled between the direct-current switch and each of the at least one bypass switch and the at least one transistor. According to certain examples, the amplifier circuit further comprises a bypass capacitor positioned to bypass the bias resistor during the bypass mode of operation. In various examples, the at least one transistor is a field-effect transistor having a gate coupled to the input, a source coupled to the direct-current switch by the bias resistor, and a drain coupled to the output. In some examples, during the bypass mode of operation, an impedance path between the source and the drain of the at least one transistor is coupled in series with the inductor. According to various examples, during the bypass mode of operation, the gate of the at least one transistor is further coupled by the inductor and the bias resistor to a voltage source.

In various examples, the at least one bypass switch is at least one field-effect transistor bypass transistor having a source, a drain, and a gate. According to some examples, during the bypass mode of operation, the source of the at least one bypass transistor is coupled to the input, the drain of the at least one bypass transistor is coupled to the output, and the gate of the at least one bypass transistor is coupled to a voltage source. In certain examples, during the low-noise amplifier mode of operation, the source of the at least one bypass transistor is coupled to the input, the drain of the at least one bypass transistor is coupled to the output, and the gate of the at least one bypass transistor is coupled to the electrical ground by at least the direct-current switch.

According to various aspects of the present disclosure, provided is a method of operating an amplifier circuit. In one example, the method comprises the acts of receiving a radio-frequency signal at an input, operating a direct-current switch to select between at least a bypass mode of operation and a low-noise amplifier mode of operation of the amplifier circuit, during the low-noise amplifier mode of operation, coupling the input to an output via at least one transistor of a low-noise amplifier circuit, and coupling an inductor interposed between the input and the direct current switch to an electrical ground via the direct-current switch to bias the at least one transistor and amplify the radio-frequency signal, and during the bypass mode of operation, coupling the input to the output via at least one bypass switch of a bypass circuit to route the radio-frequency signal from the input to the output, and decoupling the inductor from the electrical ground.

In various examples, operating the direct-current switch to select the bypass mode of operation includes opening the direct-current switch, and operating the direct-current switch to select the low-noise amplifier mode of operation includes closing the direct-current switch. In some examples, during the bypass mode of operation, decoupling the inductor from the electrical ground includes coupling an impedance path between a source and a drain of the at least one transistor in series with the inductor. According to some examples, during the bypass mode of operation, providing a controlled voltage derived from a voltage source to a gate of the at least one transistor via at least the inductor.

According to various examples, the at least one bypass switch is at least one field-effect transistor bypass transistor having a source, a drain, and a gate, and coupling the input to the output via the at least one bypass switch includes coupling the source of the bypass transistor to the input, coupling the drain of the bypass transistor to the output, and coupling the gate of the bypass transistor to a voltage source. In certain examples, the at least one transistor is a field-effect transistor having a source, a drain, and a gate, and coupling the input to the output via the at least one transistor of the low-noise amplifier circuit includes coupling the gate of the at least one transistor to the input, coupling the drain of the at least one transistor to the output, and coupling the source of the at least one transistor to the electrical ground by the direct-current switch.

According to aspects described herein, provided is an amplifier circuit. In one example, the amplifier circuit comprises a bypass circuit including a first transistor configured to route a radio-frequency signal between an input and an output during a bypass mode of operation, the first transistor having a first gate, a first source, and a first drain, a low-noise amplifier circuit including a second transistor configured to amplify and route the radio-frequency signal between the input and the output during a low-noise mode of operation, the second transistor having a second gate, a second source, and a second drain, a direct-current switch coupled between at least the first gate of the first transistor and an electrical ground, and the second gate of the second transistor and an electrical ground, the direct-current switch being coupled to the electrical ground during the low-noise amplifier mode of operation and de-coupled from the electrical ground during the bypass mode of operation, and an inductor coupled between the second gate of the second transistor and the electrical ground via the direct-current switch during the low-noise amplifier mode of operation, the inductor being de-coupled from the electrical ground via the direct-current switch during the bypass mode of operation.

In various examples, during the bypass mode of operation, an impedance path between the source and the drain of the second transistor is coupled in series with the inductor. According to certain examples, the amplifier circuit further comprises a bias resistor coupled between the direct-current switch and each of the first transistor and the second transistor. In certain examples, the amplifier circuit further comprises a bypass capacitor positioned to bypass the bias resistor during the bypass mode of operation.

Still other aspects, examples, and advantages of these exemplary aspects and implementations are discussed in detail below. Examples disclosed herein may be combined with other examples in any manner consistent with at least one of the principles disclosed herein, and references to "an example," "some example," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Aspects and examples relate to electronic systems and, in particular, to radio-frequency transistor-based amplifier circuits. Various aspects and embodiments provide an amplifier circuit that minimizes an impedance mismatch when switching between a bypass mode of operation and a low-noise amplifier (LNA) mode of operation thereof. Moreover, according to various examples, the amplifier circuit may maintain a low insertion loss and high third-order intercept point (IP3) during a bypass mode of operation.

As discussed above, an amplifier circuit with a bypass circuit should provide low noise performance while also providing a high gain, minimal input and output return loss, and high linearity across an operating frequency band. Since electronic systems, such as wireless devices, often include a receiver coupled to an input and/or an output of the amplifier circuit, it can be important to minimize input and output impedance mismatches when switching between modes of operation. Impedance mismatches can cause various undesirable effects that may severely degrade the performance of the wireless device, such as system level gain ripples.

Accordingly, some typical amplifier circuits include impedance matching network(s) to prevent these undesirable effects. As will be understood to one of ordinary skill in the art, typically during a bypass mode of operation, a low-noise amplifier (LNA) circuit of the amplifier circuit is shut down (i.e., inactive), and an incoming signal is routed from an input to an output via a bypass circuit. While the impedance matching network(s) of the LNA circuit may address some of the undesirable effects resulting from impedance mismatches during the LNA mode of operation, in a typical amplifier circuit, the performance of the bypass circuit can be degraded by the presence of the inactive impedance matching network(s) (and the other components of the LNA circuit) during the bypass mode of operation.

Accordingly, it is desirable to design an amplifier circuit in which the impedance matching network(s) and the components of the LNA circuit appear as an open circuit during the bypass mode of operation. To further improve the performance of the amplifier circuit during the bypass mode of operation, it may also be desirable to reduce the current consumption during the bypass mode.

Figure 1:
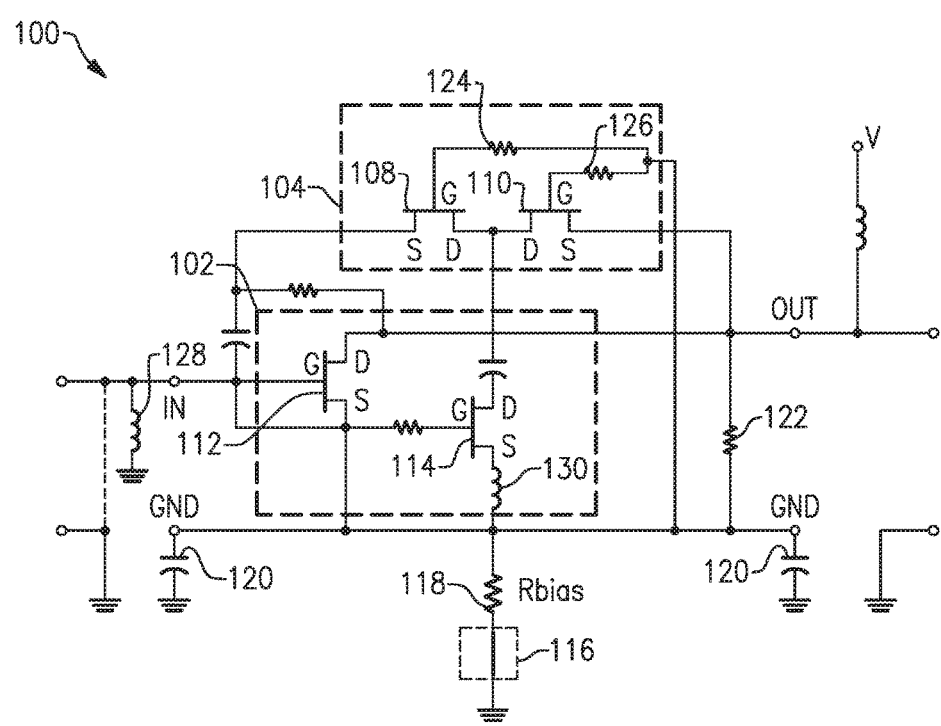
FIG. 1 is a schematic diagram of a typical amplifier circuit that includes a low-noise amplifier (LNA) circuit with a two-stage amplifier.

As discussed above, typical amplifier circuits may include a two-stage LNA amplifier. In particular, typical LNA amplifiers will include a two-stage amplifier consisting of a first stage common source gain stage and a second stage source follower that acts as an impedance matching network. FIG. 1 illustrates one example of a typical amplifier circuit 100 that has an LNA circuit 102 that includes a two-stage amplifier. The typical amplifier circuit 100 is also shown as having a bypass circuit 104 that includes a first transistor 108 and a second transistor 110. Coupled in parallel with the bypass circuit 104, the LNA circuit 102 includes a first stage transistor 112 and a second stage transistor 114. As discussed, the first stage transistor 112 may act as a common source gain stage, and the second stage transistor 114 may act as a source follower impedance matching network.

Referring to FIG. 1, during a low-noise amplifier (LNA) mode of operation, a direct-current (DC) switch 116 of the circuit 100 is turned on, and the bypass circuit 104 transistors 108, 110 are controlled to an OFF state such that an input radio-frequency (RF) signal is routed through the LNA circuit 102. That is, since a gate of each bypass transistor 108, 110 is DC grounded through a corresponding bypass resistor 124, 126 (via a bias resistor 118 and the DC switch 116), and a controlled voltage (V) is provided, the bypass circuit transistors 108, 110 are in the OFF state. As shown in FIG. 1, the bias resistor 118, which is used to self-bias the transistors 112, 114 of the LNA circuit 102, is bypassed by bypass capacitors 120. That is, the bypass capacitors 120 are used to eliminate the undesirable effects of the bias resistor 118 (e.g., gain degradation and noise figure at an operating frequency) during the LNA mode of operation. Accordingly, the RF signal is received and amplified by the transistors 112, 114 of the LNA circuit 102 to provide an amplified RF output signal. An inductor 128 coupled to an input of the circuit 100 may be used for input impedance matching during the LNA mode of operation, and may be used to DC bias (e.g., to 0V) the LNA circuit 102. An additional inductor 130 is coupled to the source of the transistor 114.

During the bypass mode of operation, the RF signal is routed through the bypass circuit 104. To initiate the bypass mode of operation, the DC switch 116 is deactivated and the LNA circuit 102 transistors 112, 114 are coupled to an RF ground through the bypass capacitors 120. Accordingly, even though the transistors 112, 114 of the LNA circuit 102 are in an OFF state (i.e., no DC current flows through them), the components of the LNA circuit 102 can present a significant parasitic that degrades the performance of the bypass circuit 104. Specifically, the second stage transistor 114 of the LNA circuit 102 may have a particular impact on the bypass circuit 104 performance. It is further appreciated that input/output impedance matching network(s) included within the LNA circuit 102 for use in LNA mode are not removed during the bypass mode of operation and, therefore, may further degrade the performance of the bypass circuit 104 during the bypass mode.

Figure 2A:
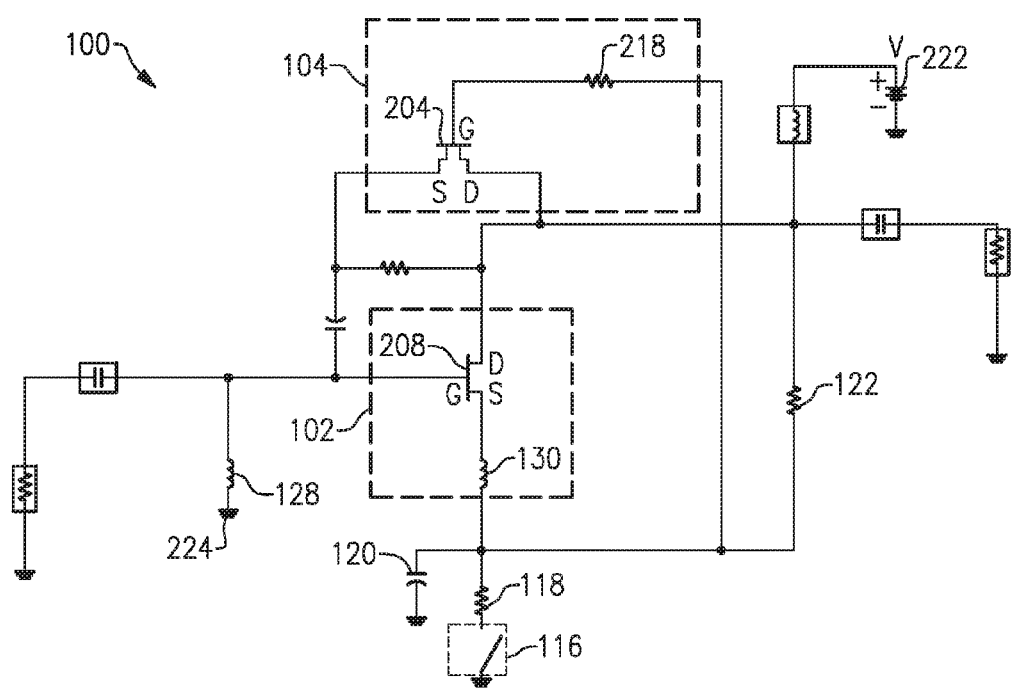
FIG. 2A is a simplified schematic diagram of the typical amplifier circuit of FIG. 1 during a bypass mode of operation.
Figure 2B:
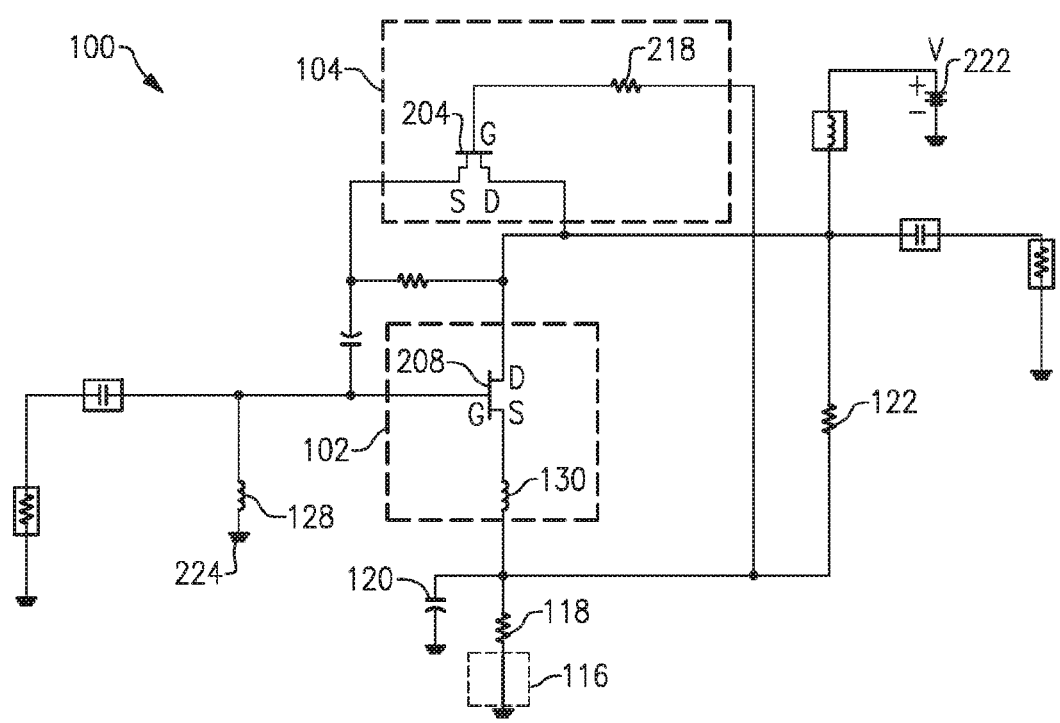
FIG. 2B is a simplified schematic diagram of the typical amplifier circuit of FIG. 1 during a low-noise amplifier mode of operation.

Referring now to FIGS. 2A and 2B, illustrated are simplified schematic diagrams of the typical amplifier circuit 100 shown in FIG. 1. In particular, FIG. 2A illustrates a simplified schematic diagram of the amplifier circuit 100 during the bypass mode of operation, and FIG. 2B illustrates a simplified schematic diagram of the amplifier circuit 100 during the low-noise amplifier mode of operation. Within FIGS. 2A and 2B, the bypass circuit 104 is simplified as a transistor 204 and a bypass resistor 218, the LNA circuit 102 is simplified as transistor 208 the inductor 130, and the bypass capacitors 120 are simplified as a single capacitor 120. FIGS. 2A and 2B show other components coupled to the input and the output of the circuit 100 (e.g., resistive and capacitive components).

As illustrated in FIG. 2A, during the bypass mode of operation, the DC switch 116 is turned off (i.e., opened). Accordingly, a gate of the transistor 204 is raised to a high voltage through the resistor 218 and the resistor 122, via a controlled voltage source 222 (V). Since the voltage at the drain of the transistor 204 is also at a high voltage, the transistor 204 is in an ON state.

Also during the bypass mode of operation, a gate of transistor 208 is DC grounded through the inductor 128. Accordingly, during the bypass mode the transistor 208 is in the OFF state. As illustrated in FIGS. 2A and 2B, the inductor 128 is directly coupled to a DC ground 224. The inductor 218 may be used for input impedance matching during the LNA mode of operation, and may be used to DC bias (e.g., to 0V) the gate of the transistor 208 during the LNA mode of operation, as discussed with reference to FIG. 1. However, an inductor coupled in shunt to a DC ground (e.g., the inductor 128 coupled to DC ground 224) creates various undesirable effects during the bypass mode of operation. In particular, the inductor 128 may introduce parasitics, that degrade the performance of the amplifier circuit 100. Moreover, the amplifier circuit 100 may experience further undesirable parasitic effects during the bypass mode of operation as a result of a position of the transistor 208 within the amplifier circuit 100, even though the transistor 208 is in the OFF state.

Referring now to FIG. 2B, the typical amplifier circuit 100 may also experience various undesirable effects during the LNA mode of operation. During the LNA mode, the DC switch 116 is turned on (i.e., closed), and the bypass capacitor 120 is used to short circuit the bias resistor 118 and the DC switch 116 for RF frequencies of the operating frequency band of the amplifier circuit 100. During the LNA mode of operation, the gate of the transistor 204 is grounded through the resistors 218 and 118 and the DC switch 116. The drain of the transistor 204 is held at a high controlled voltage (V). Therefore, during the LNA mode of operation, the transistor 204 of the bypass circuit 104 is in an OFF state. In contrast, transistor 208 is biased in an ON state. That is, a desired difference in potential is achieved between the gate and source terminals of the transistor 208 such that the transistor 208 operates in a high gain mode to amplify the received RF signal. During the LNA mode of operation, the inductor 128 remains coupled in shunt directly to the DC ground 224.

Various aspects and examples described herein overcome the shortcomings of the typical amplifier circuit architecture 100 illustrated in FIGS. 1, 2A and 2B. In particular, various aspects and examples provide an amplifier circuit that minimizes an impedance mismatch when switching between a bypass mode of operation and a low-noise amplifier mode of operation, and minimizes the undesirable parasitics that may be introduced by the inductor 128 and the transistor 208 of the amplifier circuit 100 during the bypass mode of operation. Moreover, according to various examples, the amplifier circuit may also maintain a low insertion loss and high third-order intercept point (IP3) during the bypass mode of operation. For example, in one implementation examples of the amplifier circuits described herein match an optimal impedance for a best noise figure at an input, and match a 50 ohm impedance at an output of the amplifier circuit, despite one or more changes between a bypass mode and an LNA mode of operation (or vice versa). Accordingly, various aspects and examples disclosed herein may provide important functionality that is not available in conventional amplifier circuits.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 3A:
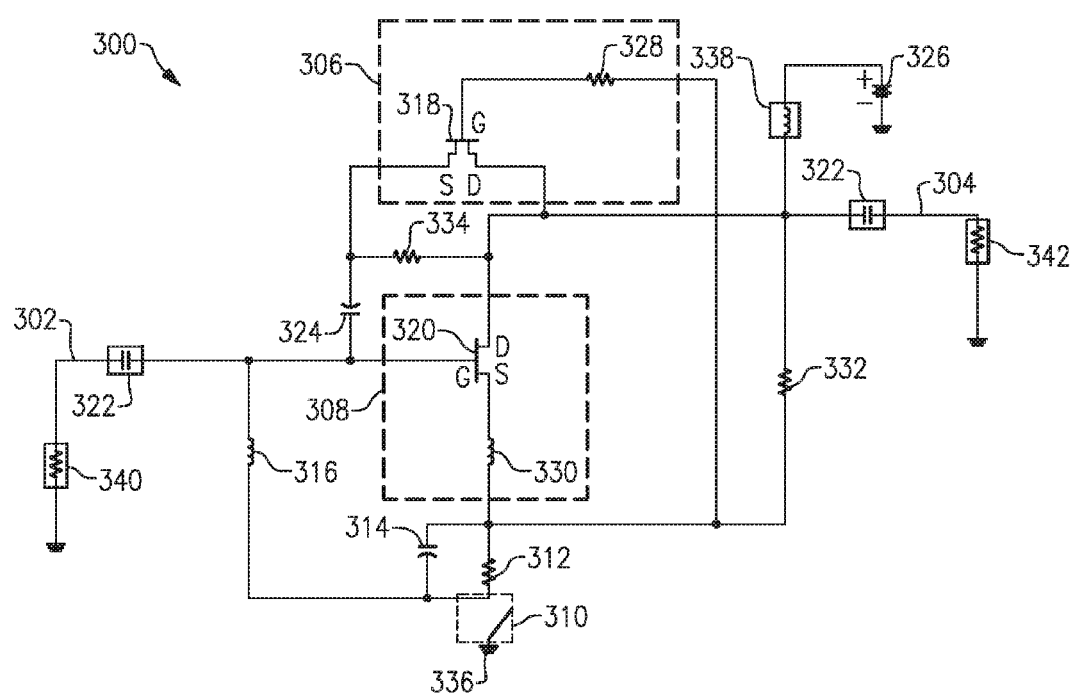
FIG. 3A is a simplified schematic diagram of an example amplifier circuit during a bypass mode of operation, according to various aspects described herein.

Referring to FIG. 3A, illustrated is a schematic diagram of an example amplifier circuit 300 during a bypass mode of operation, according to various aspects and examples. As illustrated, the amplifier circuit 300 may include an input 302, an output 304, a bypass circuit 306 selectively coupled between the input 302 and the output 304, a low-noise amplifier (LNA) circuit 308 selectively coupled between the input 302 and the output 304, a direct-current (DC) switch 310, a bias resistor 312, a bypass capacitor 314, and an inductor 316, among various other components. Each of the bypass circuit 306 and the LNA circuit 308 may include a corresponding transistor or transistors. For instance, FIG. 3A illustrates the bypass circuit 306 as including a bypass switch (e.g., bypass transistor 318), and the LNA circuit as including a gain stage transistor 320. While shown in FIGS. 3A and 3B as including single transistors (i.e., bypass transistor 318 and gain stage transistor 320), in certain other examples each of the bypass circuit 306 and the LNA circuit 308 may include more than one transistor. In certain examples, the amplifier circuit 300 may further include direct-current (DC) blocking networks 322, a LNA capacitor 324, a LNA resistor 334, a voltage source 326, a bypass resistor 328, an additional inductor 330, and an additional resistor 332, among other components. Moreover, according to some examples, the amplifier circuit 300 may include other components which have not been illustrated in FIG. 3A for the convenience of description.

According to various examples, the amplifier circuit 300 may be configured to receive a radio-frequency (RF) signal at the input 302 and selectively route the RF signal through one of the bypass circuit 306 and the LNA circuit 308 to the output 304. As referred to herein, propagation of the RF signal through the bypass circuit 306 is referred to as the bypass mode of operation, and propagation of the RF signal through the LNA circuit 308 is referred to as the LNA mode of operation. As further described, the DC switch 310 may be opened or closed to select between the LNA mode of operation and the bypass mode of operation.

Referring to FIG. 3A, a first DC blocking network 322 is coupled along the input 302 to pass the RF signal and provide a high impedance to other voltages and/or currents. Similarly, another DC blocking network 322 may be coupled along the output 322 to pass the RF signal to downstream components. The bypass circuit 306 and the LNA circuit 308 are coupled in parallel between the DC blocking network 322 of the input 302 and the DC blocking network 322 of the output 304. As illustrated in FIG. 3A, the inductor 316 is coupled between the input 302 and the DC switch 310. Also coupled to the input 302 are a first contact of the LNA capacitor 324 and a gate of the transistor 320. In certain examples, each transistor 318, 320 includes a three or more terminal transistor, such as a field-effect transistor having a gate, source, and drain (shown in FIGS. 3A and 3B as "G", "S", and "D", respectively). Specifically, each transistor 318, 320 may include a transistor manufactured from gallium arsenide (GaAs), gallium nitride (GaN), indium gallium arsenide (InGaAs), or any other suitable material. While in one example, each transistor 318, 320 may be a metal-oxide-semiconductor field-effect transistor (MOSFET), in various examples, the particular type of field effect transistor may depend on the application and the circuit design requirements. For example, each transistor 318, 320 may include a pseudomorphic high electron mobility transistor (pHEMT).

A second contact of the LNA capacitor 324 is coupled to each of a source of the transistor 318 and the LNA resistor 334. As shown, the LNA resistor 334 is positioned between the second contact of the LNA capacitor 324 and a drain of the transistor 320. A source of the transistor 320 is coupled to the additional inductor 330. The additional inductor 330 is further coupled via the bias resistor 312 to the DC switch 310. As shown, the bypass capacitor 314 is positioned to bypass the bias resistor 312.

As also illustrated in at least FIG. 3A, the LNA resistor 334 is further coupled between the source and the drain of the transistor 318. A gate of the transistor 318 is coupled via the bypass resistor 328 to the additional resistor 332 and the bias resistor 312. The drain of the transistor 318 is coupled to the output 304 via the DC blocking network 322 at the output 304. In various examples, the additional resistor 332 is coupled to the voltage source 326 by a DC feed inductor 338. Voltage source 326 may include any suitable voltage source configured to provide a DC voltage. The particular value of the provided DC voltage may depend on various factors, such as the design parameters of the amplifier circuit 300. As also illustrated in FIG. 3A, the amplifier circuit 300 may also include resistive components 340, 342 coupled along the input 302 and the output 304, respectively. For instance, FIGS. 3A and 3B show a resistive component 340 coupled between the input 302 and ground, and a resistive component 342 coupled between the output and ground.

Figure 3B:
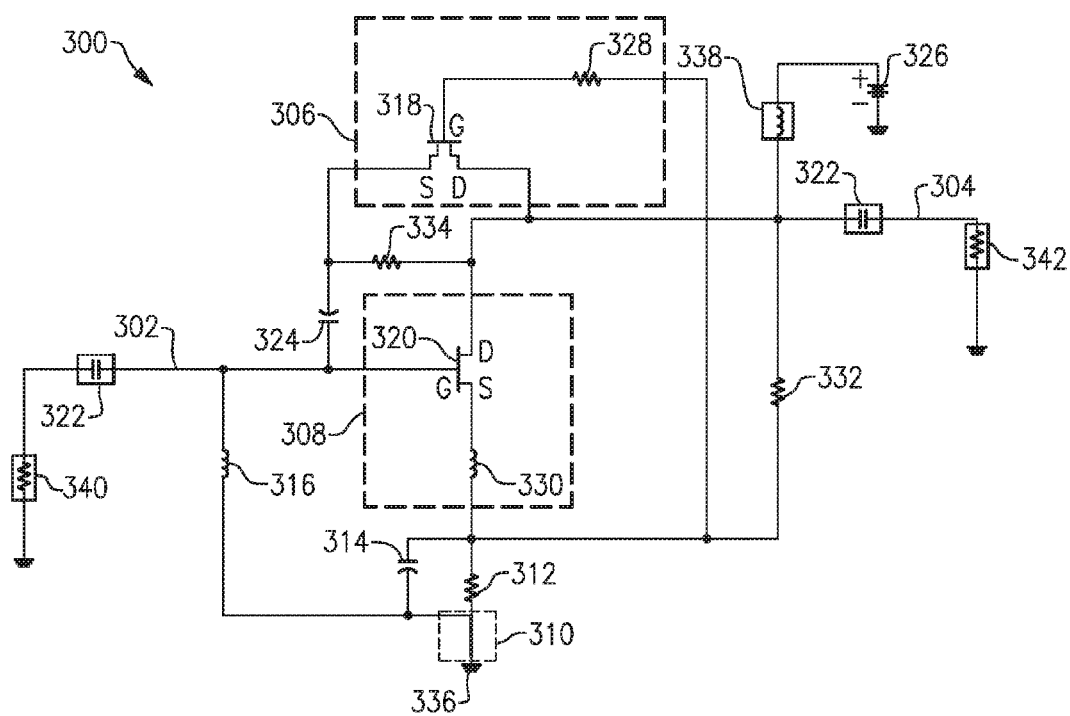
FIG. 3B is a simplified schematic diagram of the example amplifier circuit of FIG. 3A during a low-noise amplifier (LNA) mode of operation, according to various aspects described herein.

During the LNA mode of operation (as shown in FIG. 3B), the transistor 320 may operate in an ON state (e.g., high gain and low-noise mode) to receive the RF signal from the input 302, amplify the RF signal to a desired level, and provide an amplified RF signal to the output 304. The level of amplification may depend on the parameters of the transistor 320, the characteristics of the radio-frequency signal, and/or the design parameters of the amplifier circuit 300. Accordingly, the amplifier circuit 300 may be included in numerous devices in which low-noise amplification of an RF signal is important, such as a mobile phone.

During the bypass mode of operation (as shown in FIG. 3A), the DC switch 310 is turned off (e.g., opened) and the bias resistor 312 is disconnected from the DC ground 336 and floating. That is, during the bypass mode of operation the bias resistor 312 appears as an open circuit. Once the DC switch 310 is turned off, the gate of the transistor 318 rises to a controlled voltage through the bypass resistor 328 and the additional resistor 332, via the controlled voltage source 326. While in one example the voltage may be a constant 5V DC voltage, in various other examples other DC voltages may be used. A similar voltage is present at the drain and the source of the transistor 318. Accordingly, the transistor 318 is controlled to an ON state. During the ON state, the transistor 318 operates as a closed solid state switch and couples the input 302 with the output 304 to route the RF signal from the input 302 to the output 304 and bypass the LNA circuit 308. As shown, the DC blocking network 322 is positioned along the output 304 to provide a low impedance to the RF signal and a high impedance to other currents and/or voltages.

In contrast to the approach discussed above with reference to FIGS. 1, 2A, and 2B, during the bypass mode of the amplifier circuit 300 illustrated in FIG. 3A, the inductor 316 is not directly coupled in shunt to a DC ground. Instead, during the bypass mode of operation of the, the inductor 316 is coupled between the input 302 and the opened DC switch 310. Accordingly, during the bypass mode of operation, each of the source, the drain, and the gate of the transistor 320 of the LNA circuit 308 receive the controlled voltage. As such, the transistor 320 is in an ON state during the bypass mode. In particular, the source of the transistor 320 receives the controlled voltage via the additional resistor 332 and the additional inductor 330, the drain receives the controlled voltage via the voltage source 326, and the gate receives the controlled voltage via the additional resistor 332, the bias resistor 312, and the inductor 316.

Accordingly, during the bypass mode of operation, the transistor 320 of the LNA circuit 308 has a low impedance path (e.g., approximately 2 ohms) between its respective source and drain, which is in series with the inductor 316. Such an arrangement improves input/output matching, as well as, the insertion loss and linearity of the amplifier circuit 300 when compared to the typical circuit architecture illustrated in FIGS. 1, 2A, and 2B. As further illustrated in FIG. 3A, according to certain examples, during the bypass mode of operation, the bypass capacitor 314 is coupled between the inductor 316 and the DC switch 310, and therefore is not coupled to the DC ground 336. In particular, the bypass capacitor 314 bypasses only the bias resistor 312. That is, the bypass capacitor 314 does not bypass the DC switch 310. Such an arrangement is also in contrast to the typical arrangement illustrated in FIGS. 2A and 2B.

Referring now to FIG. 3B, with continuing reference to the example amplifier circuit 300 of FIG. 3A, illustrated is a schematic diagram of the example amplifier circuit 300 of FIG. 3A during the LNA mode of operation. Accordingly, the amplifier circuit 300 illustrated in FIG. 3B includes the same components as shown in FIG. 3A. During the LNA mode, the DC switch 310 is turned on (i.e., closed) to couple the bias resistor 312 to the DC ground 336. Accordingly, during the LNA mode of operation the bias resistor 312 acts as a short circuit. During the LNA mode, the gate of the transistor 318 is DC grounded through the bypass resistor 328 and the bias resistor 312. That is, the gate of the transistor 318 is coupled to the DC ground 336. The drain and the source of the transistor 318 are held at the controlled voltage of the voltage source 326. Accordingly, during the LNA mode of operation, the transistor 318 is in an OFF state and, therefore, acts as an open solid state switch. As such, the RF signal received at the input 302 is directed from the input 302 through the LNA circuit 308, and in particular, the transistor 320, to the output 304.

In various examples, during the LNA mode of operation the transistor 320 is controlled to the ON state (i.e., a high gain and low-noise state). That is, a voltage is applied to the gate, drain, and the source of the transistor 320 to achieve a desired difference in potential between the gate and the source. Specifically, the drain is held at the controlled voltage of the voltage source 326, and the source is held at a voltage such that the gate-source voltage exceeds a threshold voltage of the transistor 320. As shown in FIG. 3B, the gate of the transistor 320 is DC grounded through the inductor 316 and the DC switch 336. Accordingly, the transistor 320 is biased to amplify the RF signal to a desired level and provide an amplified RF signal to the output 304. In contrast to the typical arrangement shown in FIGS. 1, 2A, and 2B, according to various examples, during the LNA mode of operation the inductor 316 is coupled to the DC ground 336 via the DC switch 310.

Figure 3C:
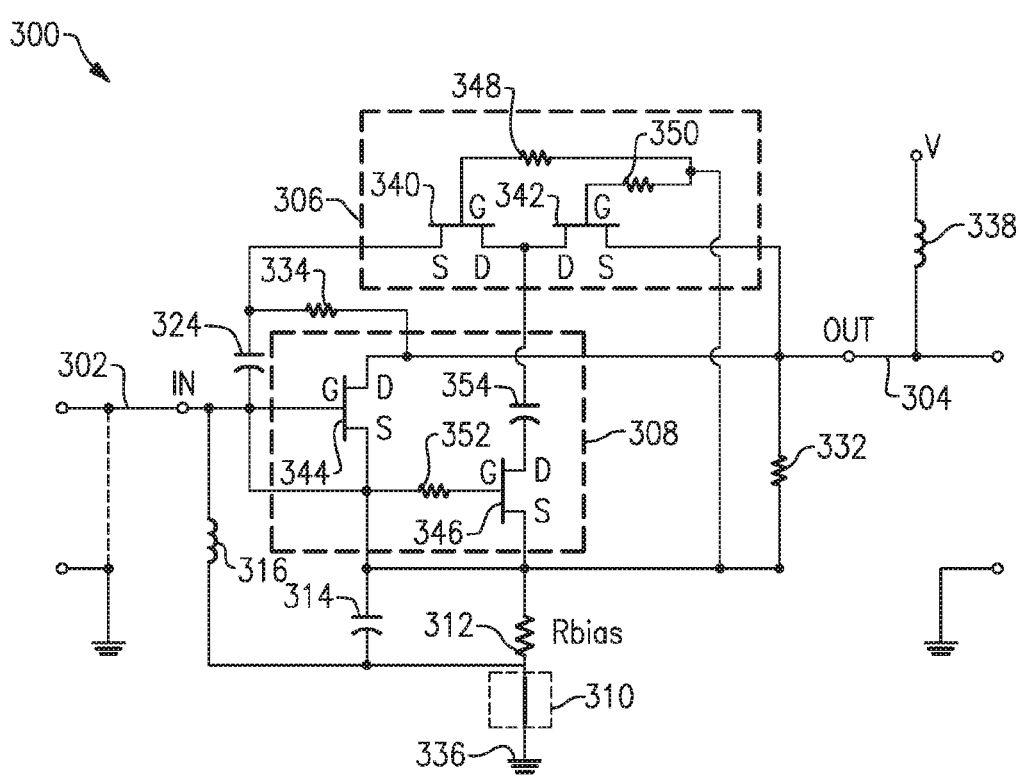
FIG. 3C is a detailed schematic diagram of the example amplifier circuit of FIGS. 3A and 3B during the LNA mode of operation, according to various aspects described herein.

FIG. 3C illustrates a more detailed schematic diagram of the amplifier circuit 300 shown in FIGS. 3A and 3B. In particular, FIG. 3C illustrates the amplifier 300 during the LNA mode of operation. In FIG. 3C, the bypass circuit 306 is illustrated as including a first switch (e.g., first transistor 340) coupled to a second switch (e.g., second transistor 342). The first transistor 340 is coupled to the second transistor 342 at the corresponding drains thereof. Further, each of the first transistor 340 and the second transistor 342 have a corresponding gate-coupled bypass resistor 348, 350. During the LNA mode of operation, each bypass resistor 348, 350 is coupled to the DC ground 336 via the bias resistor 312 and the DC switch 310.

In FIG. 3C, the LNA circuit 308 includes a third transistor 344 and a fourth transistor 346. The LNA capacitor 324 and the LNA resistor 334 are coupled to the gate and the drain, respectively, of the third transistor 344, as discussed above with reference to the transistor 320 shown in FIG. 3B. The gate of the third transistor 344 is also coupled to the input line 302 to receive the RF signal. A gate of the fourth transistor 346 is coupled to the source of the first transistor 344 via an additional LNA resistor 352. The source of the fourth transistor 346 is coupled to the bias resistor 312, and the drain of the fourth transistor 346 is coupled to the drain of the first transistor 340 and the drain of the second transistor 342 via an additional LNA capacitor 354. Various other components within the schematic diagram of FIG. 3C are described with reference to FIGS. 3A and/or 3B.

Figure 4A:
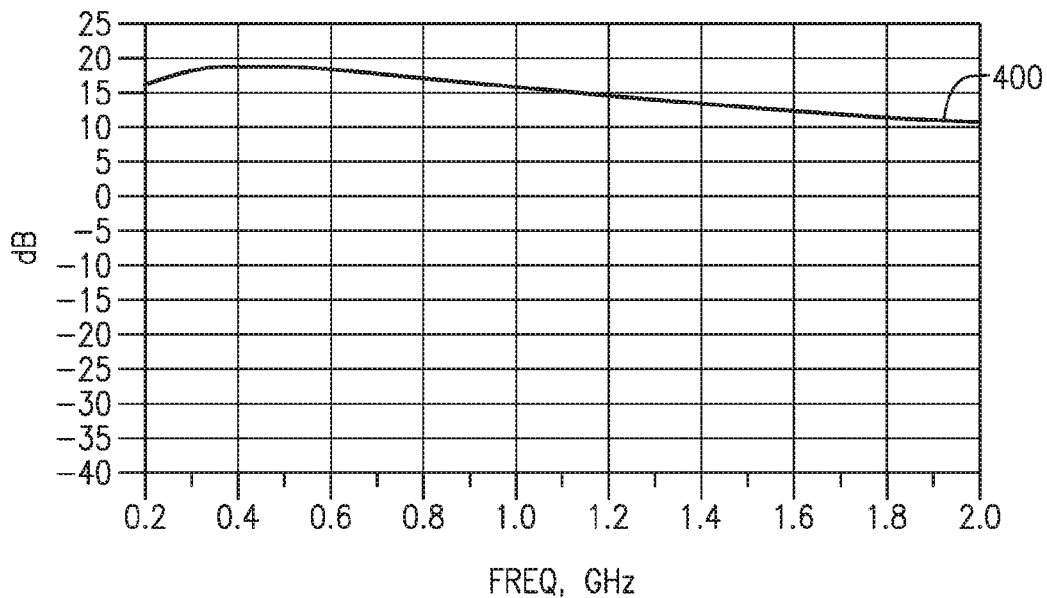
FIGS. 4A, 4B, 4C, and 4D are example graphical illustrations of the performance of the typical amplifier circuit of FIG. 1.
Figure 4B:
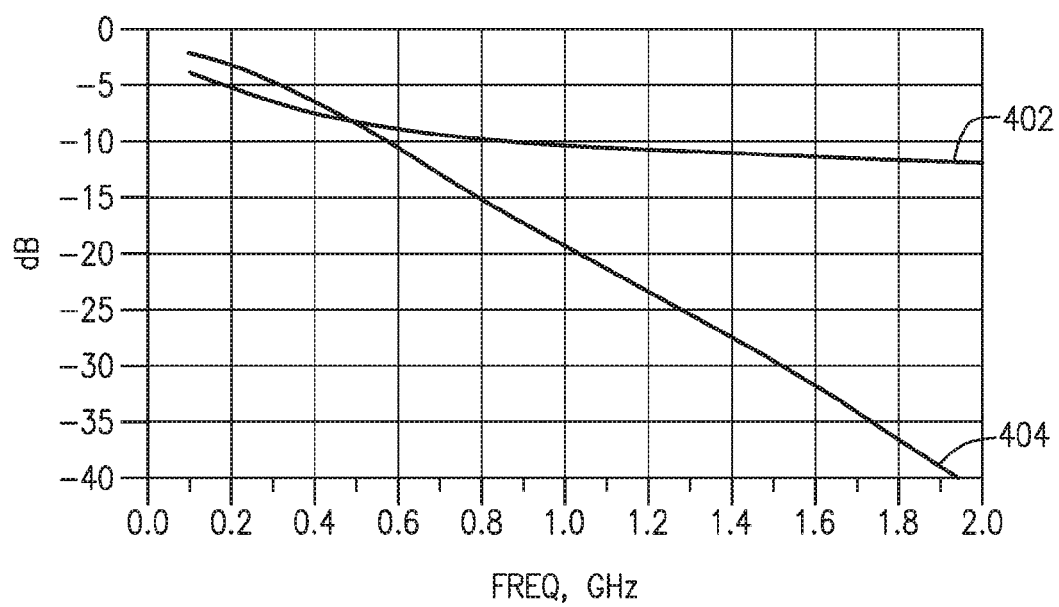
Figure 4C:
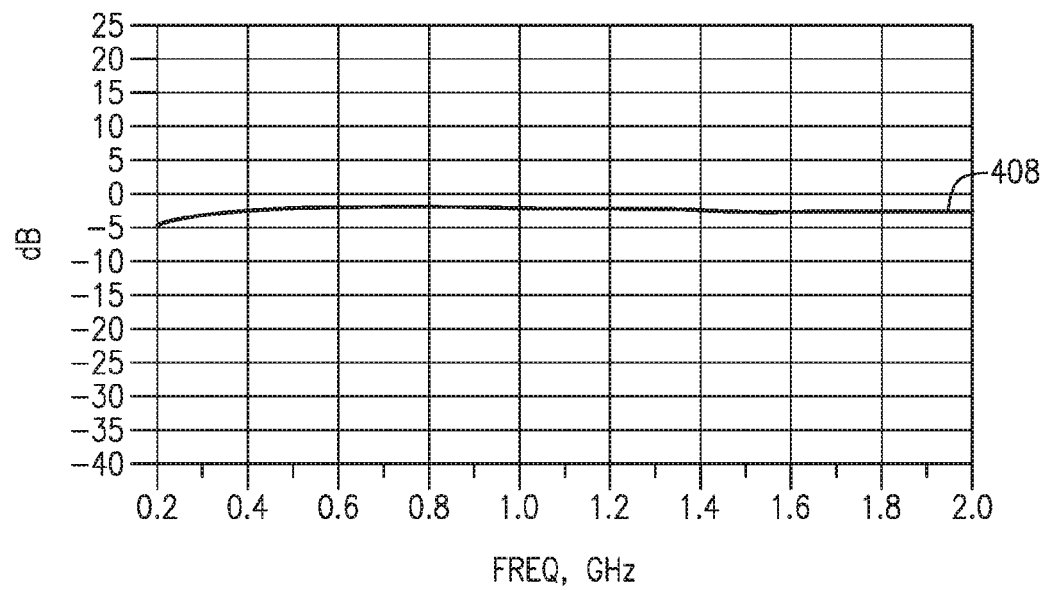
Figure 4D:
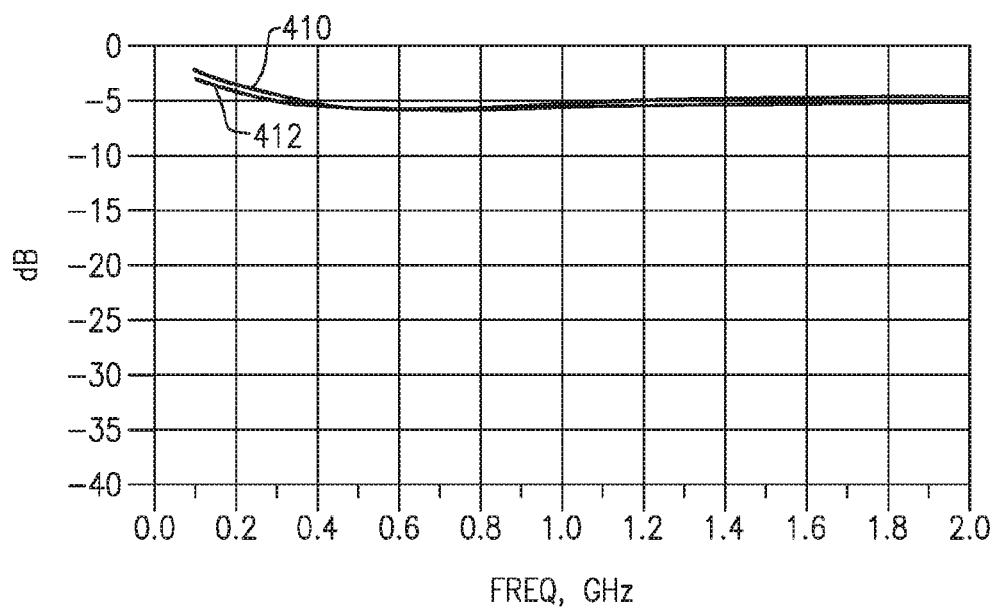

FIGS. 4A-4D are example graphical illustrations of the performance of the typical amplifier circuit of FIG. 1. In particular, FIG. 4A illustrates a plot 400 of the gain of the example circuit 100 during the LNA mode of operation, and FIG. 4B illustrates plots 402, 404 of the Input/Output return loss of the example circuit 100 during the LNA mode of operation. FIG. 4C illustrates a plot 408 of the insertion loss of the example circuit 100 during the bypass mode of operation, and FIG. 4D illustrates plots 410, 412 of the Input/Output return loss of the example circuit 100 during the bypass mode of operation. In FIGS. 4A-4D, the vertical axis indicates gain (in dB) and the horizontal axis represents the frequency of a radio-frequency signal (in GHz).

Figure 5A:
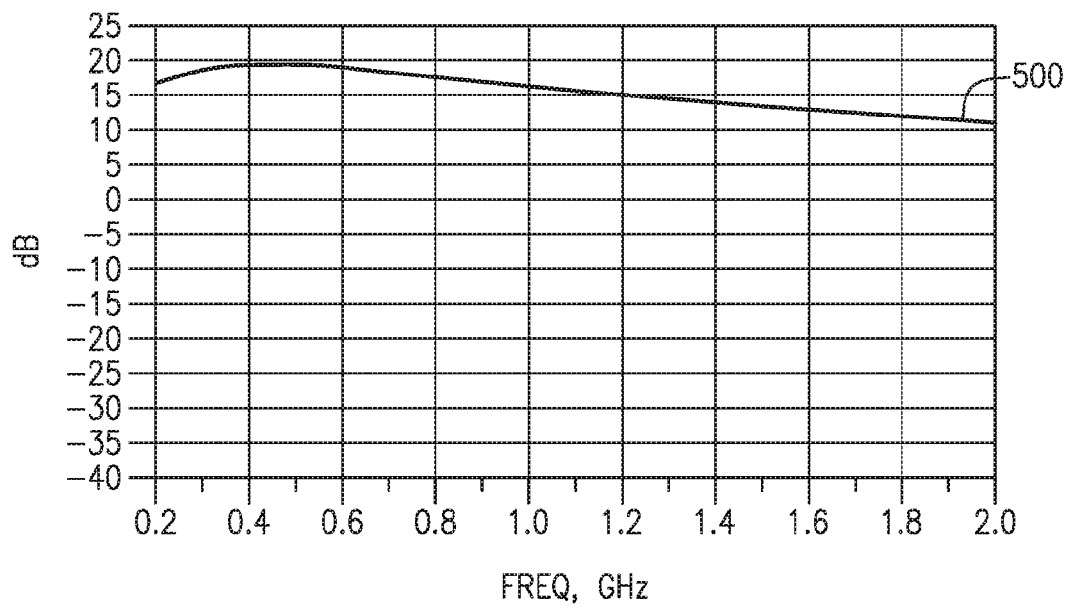
FIGS. 5A, 5B, 5C, and 5D are example graphical illustrations of the performance of the example amplifier circuit of FIG. 3A, according to various aspects described herein.
Figure 5B:
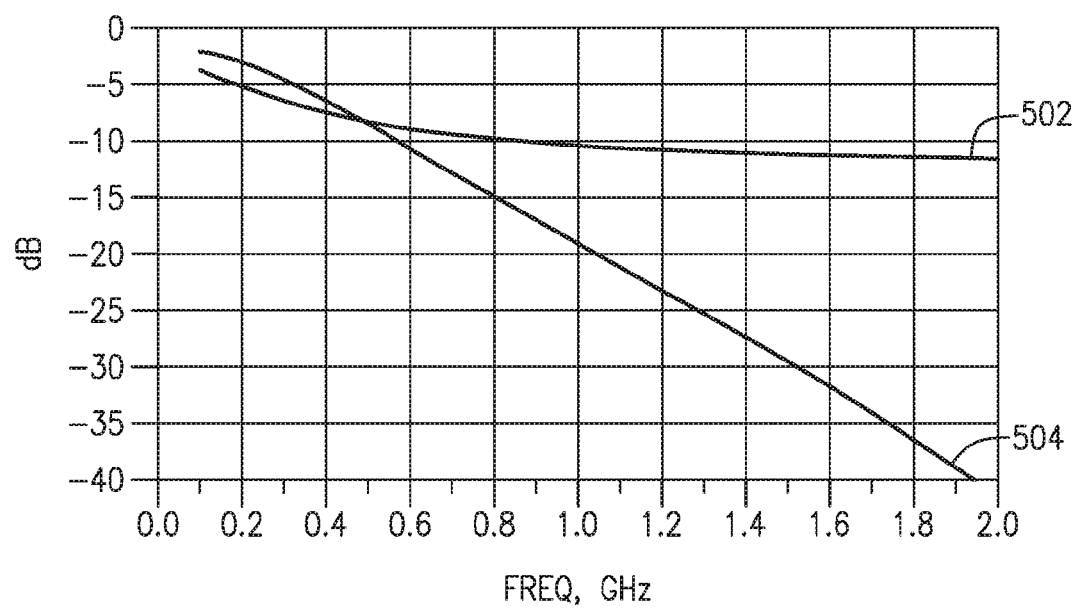
Figure 5C:
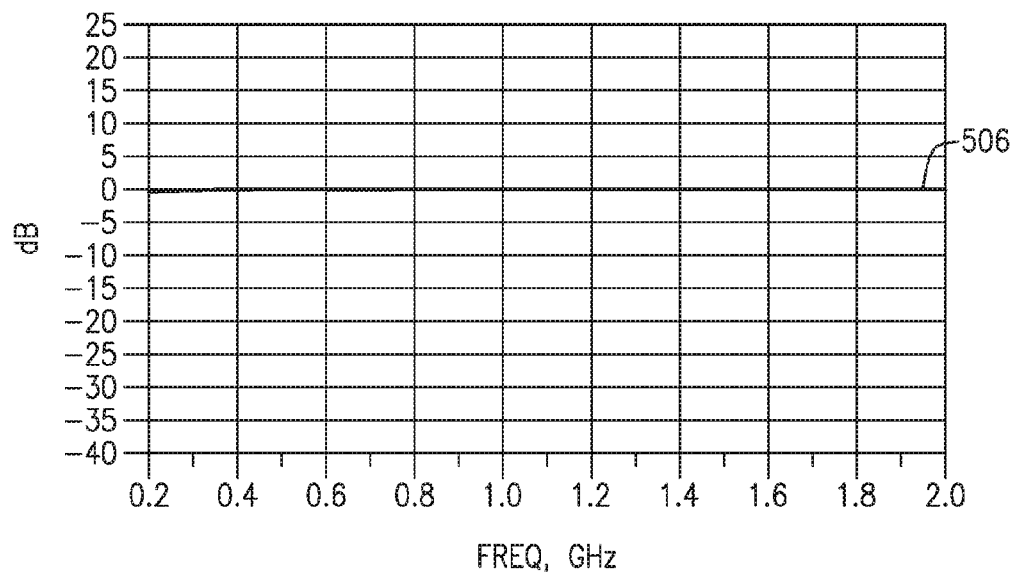
Figure 5D:
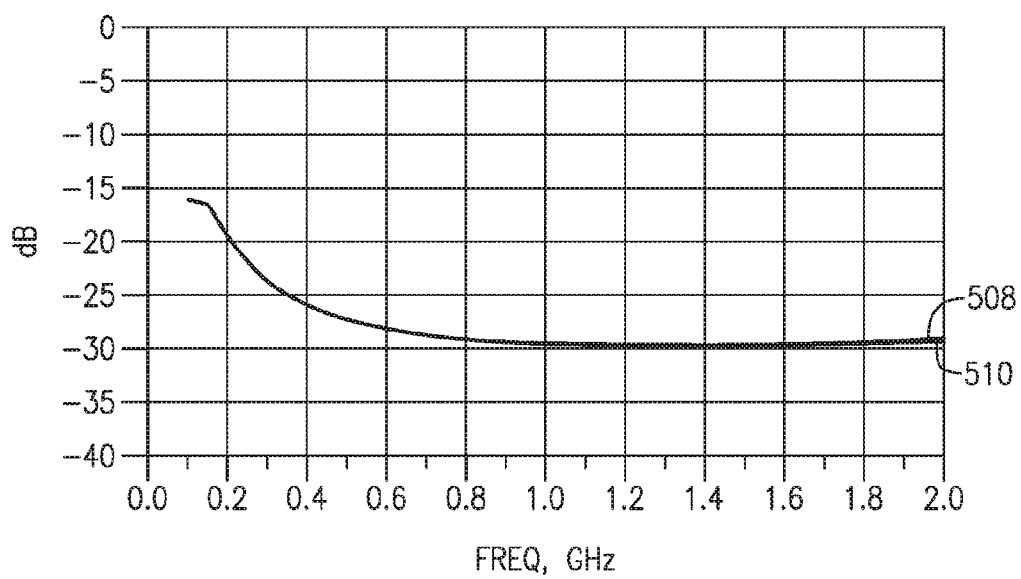

In contrast to FIGS. 4A-4D, FIGS. 5A-5D are example graphical illustrations of the performance of the example amplifier circuit 300 of FIGS. 3A and 3B. In particular, FIG. 5A illustrates a plot 500 of the gain of the amplifier circuit 300 during the LNA mode of operation, and FIG. 5B illustrates plots 502, 504 of the Input/Output return loss of the amplifier circuit 300 during the LNA mode of operation. FIG. 5C illustrates a plot 506 of the insertion loss of the amplifier circuit 300 during the bypass mode of operation, and FIG. 5D illustrates plots 508, 510 of the Input/Output return loss of the amplifier circuit 300 during the bypass mode of operation. Similar to FIGS. 4A-4D, in FIGS. 5A-5D the vertical axis indicates gain (in dB) and the horizontal axis represents the frequency of a radio-frequency signal (in GHz). As can be seen by a comparison of FIGS. 4A-4D and FIGS. 5A-5D, the gain and Input/Output return loss of the example amplifier circuit 300 is substantially the same as the typical amplifier circuit 100 of FIG. 1 during the LNA mode of operation. However, the insertion loss and the Input/Output return loss of the amplifier circuit 300 of the present disclosure is considerably improved relative to the conventional amplifier circuit 100 of FIG. 1 during the bypass mode of operation.

Figure 6:
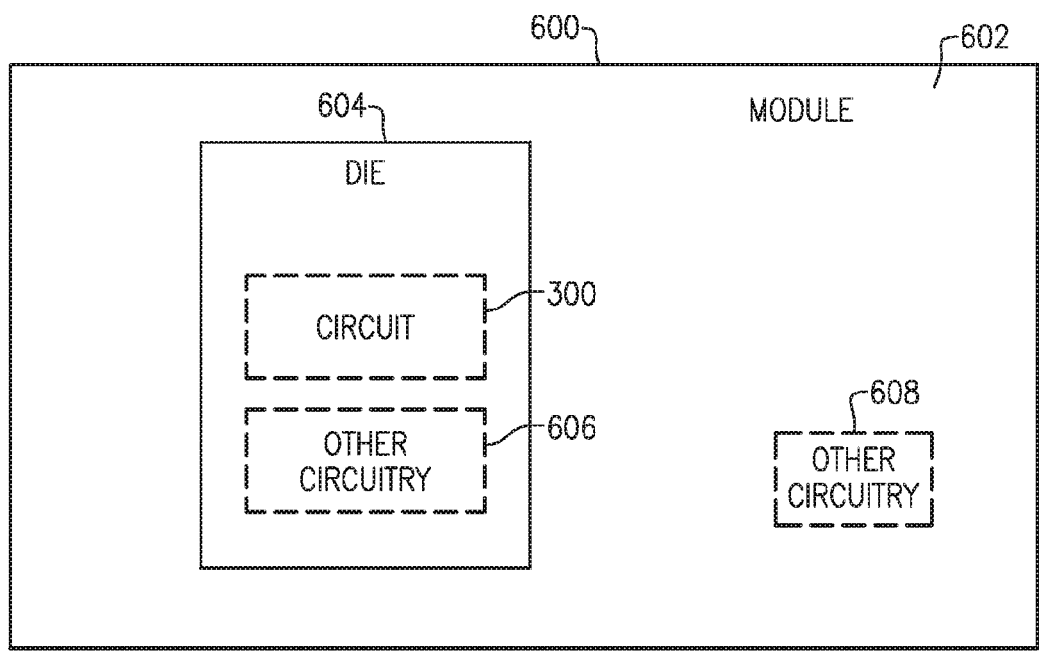
FIG. 6 is a block diagram of one example of a radio-frequency module according to various aspects described herein.

According to certain examples, various components of the amplifier circuit 300 may be integrated within a shared substrate, and in particular, packaged within the same circuit module. FIG. 6 is a block diagram of one example of a module 600 that can include an implementation of the example amplifier circuit 300 illustrated in FIGS. 3A and 3B. The example module 600 of FIG. 6 is discussed within continuing reference to the example amplifier circuit 300 illustrated in FIGS. 3A and 3B.

In the illustrated example of FIG. 6, the module 600 includes a packaging substrate 602 that is configured to receive a plurality of components. In some examples, such components can include a die 604 having components of the amplifier circuit 300 (as illustrated in FIG. 3), such as the bypass circuit 306 and the LNA circuit 308. In some examples, other circuitry or components 606, 608 can be integrated in the die 604 or mounted on or formed on the packaging substrate 602. For instance, FIG. 6 shows both other circuitry or components 606 integrated in the die 604, as well as, other circuitry or components mounted or formed on the substrate 602. In some examples, the packaging substrate 602 can include a laminate substrate.

In some examples, the module 600 can also include one or more packaging structures to, for example, provide protection and facilitate easier handling of the module 600. Such a packaging structure can include an overmold formed over the packaging substrate 602 and dimensioned to substantially encapsulate the various dies and components thereon. As discussed above, it will be understood that although the module 600 is described in the context of wirebond-based electrical connections, one or more features of the present disclosure can also be implemented in other packaging configurations, including flip-chip configurations.

Figure 7:
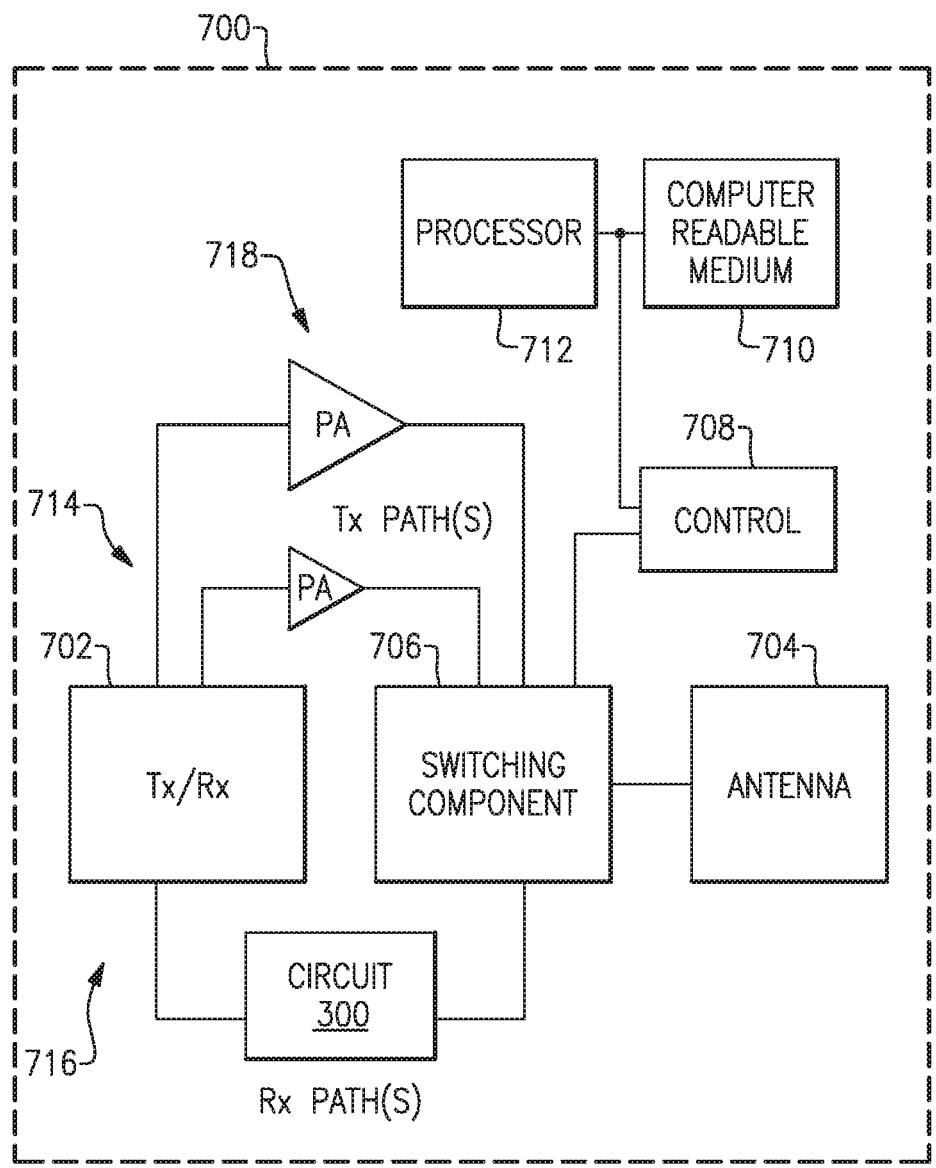
FIG. 7 is a block diagram of one example of a wireless device in which implementations of the radio-frequency module of FIG. 6 may be used, according to various aspects described herein.

FIG. 7 is a block diagram of one example of a wireless communications device 700 in which the example amplifier circuit 300 can be used. The example wireless device 700 can be a mobile phone, such as a smart phone, for example. By way of example, the wireless device 700 can communicate in accordance with Long Term Evolution (LTE). In this example, the wireless device 700 can be configured to operate at one or more frequency bands defined by an LTE standard. The wireless device 700 can alternatively or additionally be configured to communicate in accordance with one or more other communication standards, including but not limited to one or more of a Wi-Fi standard, a Bluetooth standard, a 3G standard, a 4G standard or an Advanced LTE standard.

As illustrated in FIG. 7, the wireless device 700 can include a transceiver 702, an antenna 704, a switching component 706, a control component 708, a computer readable storage medium 710, at least one processor 712, and at least one power amplifier 718. The amplifier circuit 300 can be electrically coupled to the one or more transceivers 702 and the one or more components of the switching component 706 can act as a low-noise receive amplifier. As will be appreciated by those skilled in the art, the wireless device 700 can include additional components that are not explicitly illustrated in FIG. 7 and/or a sub-combination of the illustrated components.

The transceiver 702 can generate RF signals for transmission via the antenna 704. Furthermore, the transceiver 702 can receive incoming radio-frequency signals from the antenna 704. It will be understood that various functionalities associated with transmitting and receiving of RF signals can be achieved by one or more components that are collectively represented in FIG. 7 as the transceiver 702. For example, a single component can be configured to provide both transmitting and receiving functionalities. In another example, transmitting and receiving functionalities can be provided by separate components.

In FIG. 7, one or more output signals from the transceiver 702 are depicted as being provided to the antenna 704 via one or more transmission paths 714. In the example illustrated, different transmission paths 714 can represent outputs associated with different frequency bands (e.g., a high band and a low band) and/or different power outputs. Similarly, one or more signals from the antenna 704 are depicted as being provided to the transceiver 702 via one or more receive paths 716 through the amplifier circuit 300. The switching component 706 may direct any given RF signal along the one or more transmit path 714 or the one or more receive paths 716. In the example illustrated, different receive paths 716 can represent paths associated with different signaling modes and/or different receive frequency bands. The wireless device 700 can be adapted to include any suitable number of transmission paths 714 or receive paths 716. The transmission paths 714 can include one or more power amplifiers 718 to aid in boosting a radio-frequency signal having a relatively low power to a higher power suitable for transmission.

In certain examples, the antenna 704 can be connected to an antenna terminal on the switching component 706. Similarly, the transceiver 702 can be connected to a radio-frequency terminal on the switching component 706 via one or more of the transmission paths 714 or receive paths 716. As discussed above, according to certain examples, the switching component 706 can route a received radio-frequency signal and facilitate switching between receive and/or transmit paths, by selectively electrically connecting the antenna 704 to a selected transmit or receive path. Thus, one or more of the transmission paths 714 can be active while one or more of the other transmission paths 714 are non-active, and similarly for the receive paths 716. The switching component 706 can provide a number of switching functionalities associated with an operation of the wireless device 700.

In certain examples, the at least one processor 712 can be configured to facilitate implementation of various processes on the wireless device 700. The at least one processor 712 can be, for example, implemented using hardware, software, or a combination of hardware and software. For instance, the at least one processor 712 may include one or more microprocessors or other types of controllers that can perform a series of instructions that manipulate data. However, in other examples the processor 712 may include specially-programmed, special-purpose hardware, such as for example, an application-specific integrated circuit (ASIC) tailored to perform a particular operations disclosed herein. In certain implementations, the wireless device 700 can include a non-transitory computer readable medium 710, such as a memory, which can store computer program instructions that may be provided to and executed by the at least one processor 712. Various ones of the components 706, 708, 718 and the transmission and receiver path 714, 716 may be implemented in the same die 604 as the amplifier circuit 300 or may be integrated within the same module 600 as the amplifier circuit 300.

Some of the implementations described above have provided examples in connection with mobile devices. However, the principles and advantages of the examples can be used for any other systems or apparatus, such as any uplink cellular device, that could benefit from any of the circuits described herein. Any of the principles and advantages discussed herein can be implemented in an electronic system that uses transistor based switches. Thus, aspects of this disclosure can be implemented in various electronic devices. Examples of the electronic devices can include, but are not limited to, consumer electronic products, parts of the consumer electronic products, electronic test equipment, cellular communications infrastructure such as a base station, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a clock, etc. Further, the electronic devices can include unfinished products.

Figure 8:
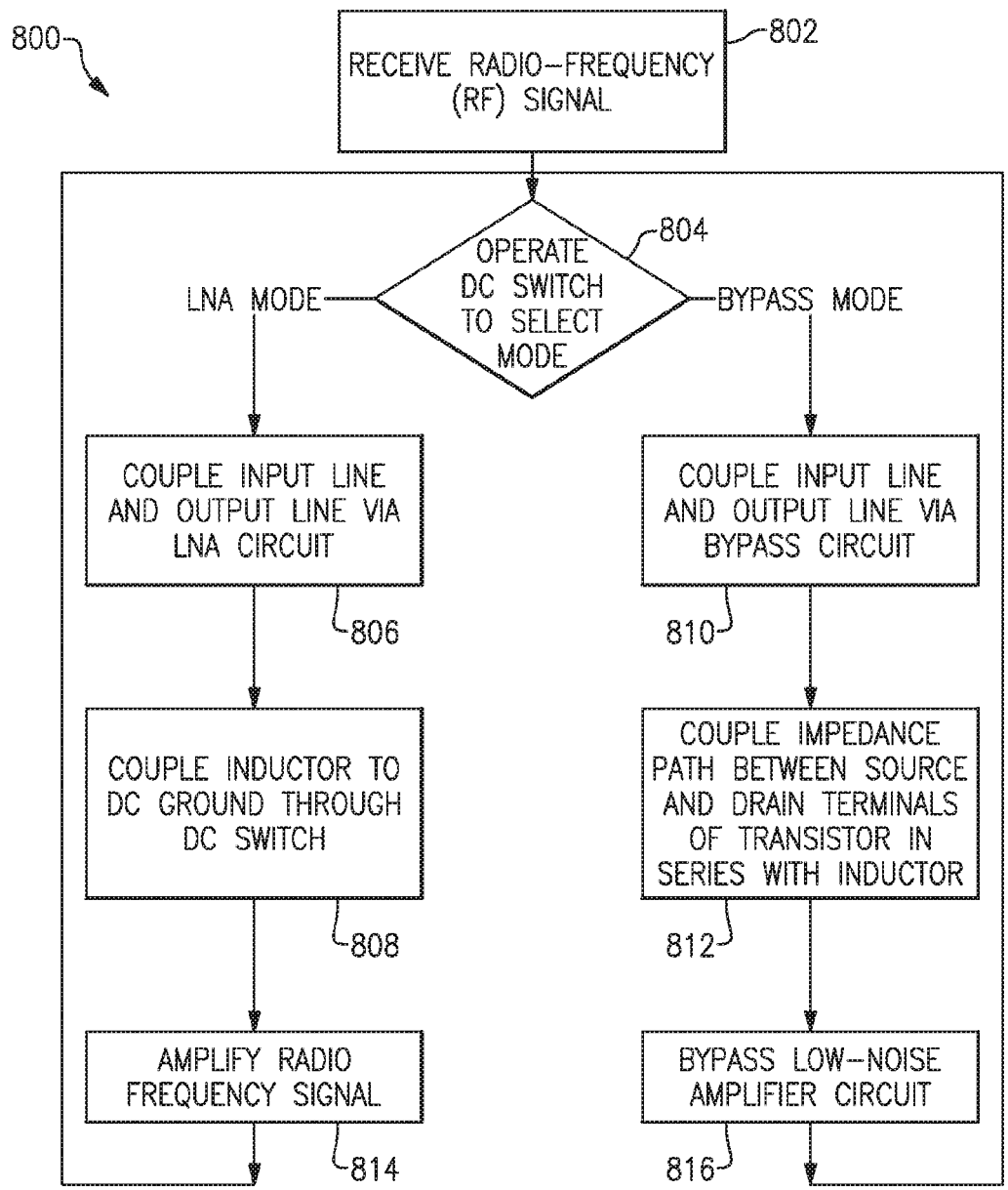
FIG. 8 is a process flow illustrating one example of a process of operating an amplifier circuit, according to various aspects described herein.

As described above with reference to at least FIGS. 3A and 3B, several examples perform processes for minimizing an impedance mismatch when switching between a bypass mode of operation and a low-noise amplifier mode of operation within an amplifier circuit. In some embodiments, these processes are executed by the components of an amplifier circuit, such as the amplifier circuit 300 described above with reference to FIGS. 3A and 3B. One example of such a process 800 is illustrated in FIG. 8. FIG. 8 is described with continuing reference to the amplifier circuit 300 illustrated in FIGS. 3A and 3B.

In act 802, the process 800 may include receiving a radio-frequency signal at the input 302 of the amplifier circuit 300. Depending on the mode of operation, the RF signal may be routed through the LNA circuit 308 or through the bypass circuit 306. In act 804, the process 800 may include operating the DC switch 310 to select between the LNA mode of operation and the bypass mode of operation. While in certain examples, the process 800 may include operating the DC switch 310 in response to receiving the RF signal, in certain other examples, the DC switch 310 may be operated prior to receiving the RF signal. To select the LNA mode of operation, the process 800 may include activating the DC switch 336 (e.g., closing the DC switch 336). When closed, the DC switch 336 couples the bias resistor 312, and one or more components of the LNA circuit 308 and the bypass circuit 306 to the DC ground 336. To select the bypass mode of operation, the process 800 may include deactivating (e.g., opening) the DC switch 336. When opened, the bias resistor is disconnected from the DC ground 336 and left floating.

In act 806, during the LNA mode of operation, the process 800 may include coupling the input 302 and the output 304 via the LNA circuit 308. More specifically, act 806 may include coupling the input 302 and the output 304 with the respective transistor 320 of the LNA circuit 308. Also during the LNA mode of operation, the process 800 may include coupling the inductor 316 to the electrical ground 336 via the DC switch 310 to bias the transistor 320 in a high gain mode of operation (act 808). In act 814, the process 800 includes amplifying the RF signal with the LNA circuit 308, and in particular, the transistor 320, to provide an amplified RF signal at the output 304.

In various examples, to amplify the RF signal, the process 800 includes DC grounding the gate of the transistor 318 through the bypass resistor 328 and the bias resistor 312. That is, the process 800 may include coupling the gate of the transistor 318 to the DC ground 336. During the LNA mode, the process 800 may further include applying a controlled voltage at the drain and source of the transistor 318 such that the transistor 318 is in the OFF state. To amplify the RF signal, the process 800 includes applying a voltage to the drain, source, and gate of the transistor 320 to bias the transistor 320 to amplify the RF signal. Specifically, the drain is held at the controlled voltage of the voltage source 326, the source is held at a voltage such that the gate-source voltage exceeds a threshold voltage of the transistor 320, and the gate of the transistor 320 is DC grounded through the inductor 316 and the DC switch 336.

In act 810, during the bypass mode of operation, the process 800 may include coupling the input 302 and the output 304 via the bypass switch (e.g., the transistor 318) of the bypass circuit 306 to route the RF signal received at the input 302 from the input 302 to the output 304. In act 812, the process 800 may include coupling an impedance path between the source and the drain of the transistor 320 in series with the inductor 316. In particular, act 812 may include applying a controlled voltage to each of the drain, source, and gate of the transistor 320 such that the transistor 320 is operated in an ON state. That is, during the bypass mode of operation both the transistor 318 and the transistor 320 are in the ON state. As discussed above with reference to FIG. 3A, during the bypass mode of operation, the inductor 316 is not coupled to the DC ground 336, and is instead coupled between the input 302 and the DC switch 336. Accordingly, the process 300 may include providing the controlled voltage to the gate of the transistor 320 via the additional resistor 332, the bias resistor 312, and the inductor 316. During the bypass mode of operation, the process 800 may further include providing the controlled voltage to the source of the transistor 320 via the additional resistor 332 and the additional inductor 330, and providing the controlled voltage to the drain of the transistor 320 via the voltage source 326. In act 816, the process 800 includes routing the RF signal from the input 302 to the output 304 through the bypass circuit 306.

While not explicitly illustrated or described with reference to FIG. 8 for the convenience of description, the example process 800 illustrated therein may include further acts and processes. Examples of these additional acts and processes are described with reference to the example amplifier circuit 300 illustrated in FIGS. 3A and 3B.

Having described above several aspects of at least one example, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. An amplifier circuit comprising:
   an input to receive a radio-frequency signal;
   an output;
   a bypass circuit selectively coupled between the input and the output via at least one bypass switch, the at least one bypass switch being configured to couple the input and the output through the bypass circuit during a bypass mode of operation of the amplifier circuit;
   a low-noise amplifier circuit coupled between the input and the output and including at least one transistor, the at least one transistor being configured to couple the input and the output through the low-noise amplifier circuit during a low-noise amplifier mode of operation of the amplifier circuit;
   a direct-current switch coupled to at least the bypass circuit and the low-noise amplifier circuit and configured to select between the bypass mode of operation and the low-noise amplifier mode of operation; and
   an inductor interposed between the input and the direct-current switch, the inductor being coupled to an electrical ground via the direct-current switch during the low-noise amplifier mode of operation.

2. The amplifier circuit of claim 1 wherein the direct-current switch is configured to de-couple the inductor from the electrical ground during the bypass mode of operation.

3. The amplifier circuit of claim 2 further comprising a bias resistor coupled between the direct-current switch and each of the at least one bypass switch and the at least one transistor.

4. The amplifier circuit of claim 3 further comprising a bypass capacitor positioned to bypass the bias resistor during the bypass mode of operation.

5. The amplifier circuit of claim 4 wherein the at least one transistor is a field-effect transistor having a gate coupled to the input, a source coupled to the direct-current switch by the bias resistor, and a drain coupled to the output.

6. The amplifier circuit of claim 5 wherein, during the bypass mode of operation, an impedance path between the source and the drain of the at least one transistor is coupled in series with the inductor.

7. The amplifier circuit of claim 6 wherein, during the bypass mode of operation, the gate of the at least one transistor is further coupled by the inductor and the bias resistor to a voltage source.

8. The amplifier circuit of claim 1 wherein the at least one bypass switch is at least one field-effect transistor bypass transistor having a source, a drain, and a gate.

9. The amplifier circuit of claim 8 wherein, during the bypass mode of operation, the source of the at least one bypass transistor is coupled to the input, the drain of the at least one bypass transistor is coupled to the output, and the gate of the at least one bypass transistor is coupled to a voltage source.

10. The amplifier circuit of claim 8 wherein, during the low-noise amplifier mode of operation, the source of the at least one bypass transistor is coupled to the input, the drain of the at least one bypass transistor is coupled to the output, and the gate of the at least one bypass transistor is coupled to the electrical ground by at least the direct-current switch.

11. A method of operating an amplifier circuit, comprising the acts of:
    receiving a radio-frequency signal at an input;
    operating a direct-current switch to select between at least a bypass mode of operation and a low-noise amplifier mode of operation of the amplifier circuit;
    during the low-noise amplifier mode of operation, coupling the input to an output via at least one transistor of a low-noise amplifier circuit, and coupling an inductor interposed between the input and the direct current switch to an electrical ground via the direct-current switch to bias the at least one transistor and amplify the radio-frequency signal; and
    during the bypass mode of operation, coupling the input to the output via at least one bypass switch of a bypass circuit to route the radio-frequency signal from the input to the output, and decoupling the inductor from the electrical ground.

12. The method of claim 11 wherein operating the direct-current switch to select the bypass mode of operation includes opening the direct-current switch, and operating the direct-current switch to select the low-noise amplifier mode of operation includes closing the direct-current switch.

13. The method of claim 12 wherein, during the bypass mode of operation, decoupling the inductor from the electrical ground includes coupling an impedance path between a source and a drain of the at least one transistor in series with the inductor.

14. The method of claim 13 further comprising, during the bypass mode of operation, providing a controlled voltage derived from a voltage source to a gate of the at least one transistor via at least the inductor.

15. The method of claim 11 wherein the at least one bypass switch is at least one field-effect transistor bypass transistor having a source, a drain, and a gate, and coupling the input to the output via the at least one bypass switch includes coupling the source of the bypass transistor to the input, coupling the drain of the bypass transistor to the output, and coupling the gate of the bypass transistor to a voltage source.

16. The method of claim 11 wherein the at least one transistor is a field-effect transistor having a source, a drain, and a gate, and coupling the input to the output via the at least one transistor of the low-noise amplifier circuit includes coupling the gate of the at least one transistor to the input, coupling the drain of the at least one transistor to the output, and coupling the source of the at least one transistor to the electrical ground by the direct-current switch.

17. An amplifier circuit comprising:
a bypass circuit including a first transistor configured to route a radio-frequency signal between an input and an output during a bypass mode of operation, the first transistor having a first gate, a first source, and a first drain;
a low-noise amplifier circuit including a second transistor configured to amplify and route the radio-frequency signal between the input and the output during a low-noise mode of operation, the second transistor having a second gate, a second source, and a second drain;
a direct-current switch coupled between at least the first gate of the first transistor and an electrical ground, and the second gate of the second transistor and an electrical ground, the direct-current switch being coupled to the electrical ground during the low-noise amplifier mode of operation and de-coupled from the electrical ground during the bypass mode of operation; and
an inductor coupled between the second gate of the second transistor and the electrical ground via the direct-current switch during the low-noise amplifier mode of operation, the inductor being de-coupled from the electrical ground via the direct-current switch during the bypass mode of operation.

18. The amplifier circuit of claim 17 wherein, during the bypass mode of operation, an impedance path between the source and the drain of the second transistor is coupled in series with the inductor.

19. The amplifier circuit of claim 18 further comprising a bias resistor coupled between the direct-current switch and each of the first transistor and the second transistor.

20. The amplifier circuit of claim 19 further comprising a bypass capacitor positioned to bypass the bias resistor during the bypass mode of operation.

* * * * *